(12) United States Patent
Van Montfort et al.

(10) Patent No.: US 10,775,005 B2
(45) Date of Patent: Sep. 15, 2020

(54) LIGHT EMITTING DEVICE WITH A LED STRIP

(71) Applicant: SIGNIFY HOLDING B.V., Eindhoven (NL)

(72) Inventors: Vincent Johannes Jacobus Van Montfort, Sittard (NL); Johannes Petrus Maria Ansems, Hulsel (NL); Andreas Adrianus Jozef Van Dijk, Woensdrecht (NL); Miel Wellens, Peer (BE); Tjeerd Dijkstra, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/609,393

(22) PCT Filed: Apr. 26, 2018

(86) PCT No.: PCT/EP2018/060793
§ 371 (c)(1),
(2) Date: Oct. 29, 2019

(87) PCT Pub. No.: WO2018/202553
PCT Pub. Date: Nov. 8, 2018

(65) Prior Publication Data
US 2020/0182418 A1    Jun. 11, 2020

(30) Foreign Application Priority Data
May 1, 2017   (EP) ..................... 17168892

(51) Int. Cl.
*F21S 4/26*   (2016.01)
*F21V 21/34*  (2006.01)
(Continued)

(52) U.S. Cl.
CPC .............. *F21S 4/26* (2016.01); *F21V 7/0066* (2013.01); *F21V 21/34* (2013.01); *F21Y 2103/10* (2016.08); *F21Y 2115/10* (2016.08)

(58) Field of Classification Search
None
See application file for complete search history.

(56) References Cited

U.S. PATENT DOCUMENTS 7,648,251 B2   1/2010   Whitehouse et al.
9,482,396 B2   11/2016  Dixon et al.
(Continued)

FOREIGN PATENT DOCUMENTS

CN    2722028 Y      8/2005
CN    205807052 U   12/2016
WO    2014063449 A1  5/2014

*Primary Examiner* — Ashok Patel
(74) *Attorney, Agent, or Firm* — Daniel J. Piotrowski

(57) ABSTRACT

A light emitting device (1) comprising a longitudinal direction, a longitudinal axis (L) extending in the longitudinal direction, a transversal direction, a transversal axis (T) extending in the transversal direction, a height direction being perpendicular to both the longitudinal direction and the transversal direction and a height axis (H) extending in the height direction, a sleeve (2) extending in parallel with the longitudinal axis and comprising a first part (21) made of a transparent or translucent material, a second part (22) made of a diffuse material, and a channel (23) extending in parallel with the longitudinal axis and being provided in the first part of the sleeve, a reflector (3) comprising a cavity (31) extending in parallel with the longitudinal axis, a substrate (4), and a plurality of LEDs (5) adapted for, in operation, emitting light, and being arranged on the substrate (4) in such a way as to extend in a direction parallel with the longitudinal axis of the light emitting device, the substrate (4) with the plurality of LEDs (5) mounted thereon being arranged in the channel (23) of the sleeve (2). The cavity (Continued)

(31) is adapted for receiving any one of the first part (21) and the second part (22) of the sleeve, and the sleeve (2) being adapted for being mounted in the reflector (3) by inserting any one of the first part and the second part into the cavity such as to obtain either a spotty lighting effect or a diffuse lighting effect.

15 Claims, 4 Drawing Sheets

(51) Int. Cl.
*F21V 7/00* (2006.01)
*F21Y 103/10* (2016.01)
*F21Y 115/10* (2016.01)

(56) References Cited

U.S. PATENT DOCUMENTS

| | | | |
|---|---|---|---|
| 2004/0257802 A1 | 12/2004 | Helenowski | |
| 2011/0074296 A1* | 3/2011 | Shen | F21K 9/64 |
| | | | 315/112 |
| 2014/0126196 A1 | 5/2014 | Dixon et al. | |
| 2014/0268748 A1* | 9/2014 | Lay | F21S 8/04 |
| | | | 362/235 |
| 2016/0341377 A1 | 11/2016 | Eddins | |
| 2016/0356454 A1* | 12/2016 | Camarota | F21V 7/10 |
| 2017/0176787 A1* | 6/2017 | Jia | G02F 1/133308 |

* cited by examiner

LIGHT EMITTING DEVICE WITH A LED STRIP

CROSS-REFERENCE TO PRIOR APPLICATIONS

This application is the U.S. National Phase application under 35 U.S.C. § 371 of International Application No. PCT/EP2018/060793, filed on Apr. 26, 2018, which claims the benefit of European Patent Application No. 17168892.2, filed on May 1, 2017. These applications are hereby incorporated by reference herein.

FIELD OF THE INVENTION

The invention relates to a light emitting device comprising a longitudinal direction, a longitudinal axis, L, extending in the longitudinal direction, a transversal direction, a transversal axis, T, extending in the transversal direction, a height direction being perpendicular to both the longitudinal direction and the transversal direction and a height axis, H, extending in the height direction, a reflector comprising a cavity extending in parallel with the longitudinal axis, a substrate, and a plurality of LEDs adapted for, in operation, emitting light, and being arranged on the substrate in such a way as to extend in a direction parallel with the longitudinal axis of the light emitting device.

Typically, in such a light emitting device the substrate is a flexible substrate and the LEDs mounted thereon are provided as a LED strip.

BACKGROUND OF THE INVENTION

To make such a light emitting device suitable for both outdoor and indoor applications, full sealing of the substrate and the LEDs, i.e. the LED strip, is needed. Normally this is achieved by either inserting the LED strip in an extruded cover or by embedding the LED strip. The opposite ends of the light emitting device are normally sealed by endcaps and additional closing processes, such as gluing, welding, etc.

The substrate of such a LED-strip is normally flexible only in the thickness direction and has limited flexibility perpendicular to the thickness direction. The LED's are divided along the length of the substrate and have certain distances or a certain pitch with respect to each other. To keep the LED-strip as flexible as possible the cross section of the sleeve or embedding must be as thin as possible seen in the thickness direction of the substrate.

Currently two directions are commonly found to generate the desired lighting effect of such a LED-strip:

Generally, it is desired to achieve two different lighting effects with such a light emitting device, namely an indirect spotty lighting effect or indirect bright spotty lighting effect and a diffuse homogeneous lighting effect or direct diffuse homogeneous lighting effect.

US 2014/0126196 A1 discloses a light fixture which in one embodiment comprises a transparent or diffusing body with a channel for wiring and a further channel for receiving a reflector with LEDs mounted thereon, and a cover with a lens forming a light exit surface. The body and the core are connected or connectable by means of mutually engaging attachment portions.

In the prior art solutions, to obtain an indirect, spotty lighting effect, a thin sleeve being transparent or translucent is used to seal the LED strip. Mounting is normally done in tucked away areas and the observer or user will normally only see the indirect lighting effect of the LED-strip reflecting on e.g. a wall or, for outdoor applications, a fence, plants, or the like. The reason for hiding the LED strip is that the bright spotty lighting of the LEDs are not friendly for the eye to look at since as a requirement in indirect lighting applications the LEDs have to be very bright. This solution can be found in cheap consumer solutions which not always are fully suitable for outdoor use.

For quite a few applications in the outdoor or indoor environment, the indirect lighting effect does not always provide a nice lighting solution as i.e. limited white walls are available. For such applications a direct view on the LED-strip would be desired. To this end a direct, diffuse, homogeneous lighting effect is desirable.

In the prior art solutions, such a direct, diffuse, homogeneous lighting effect is normally obtained by making a less bright, diffuse and homogeneous lighting line. Technically this has been achieved by means of several different solutions, such as:

decreasing the LED-pitch so LEDs are arranged closer to each other, increasing the optical path from LED to exit surface of the sleeve, and adding diffusing materials to the sleeve which enable mixing of the light before emission.

The most commonly found prior art solution to create a homogeneous lighting LED strip is to place the LED strip vertical, and bending the light 90 degrees with a light guiding material. For this solution a white reflective surround is also needed. The exit surface of the LED-strip is then on top and has a diffuse character. The light from the LEDs is then mixed over a long distance by the light guide and finally mixed in the diffuse exit window. This solution is quite complex and expensive. It can be found in professional LED-strip solutions, but is quite bulky and inflexible.

Another solution is to mount Al-profiles with diffuse plastic covers. Not in all cases are these profiles constructed for outdoor and are not watertight and not always big enough to allow the cross sectional size needed for an LED strip rated for outdoor applications.

Also, the optical construction around a diffuse outdoor/indoor LED strip comprises a high number of components and is thus quite complex and expensive.

Furthermore, solutions employing diffusing elements normally exhibit a very low optical efficiency, and may range from well executed solutions with an optical efficiency of ~50-60% to very bad executions with an optical efficiency as low as <30%. The spotty solutions are normally better in efficiency and only have very low losses in the transparent/translucent materials.

Also, consumers might not be aware that there is quite some difference between a spotty and a diffuse lighting effect. Selecting the right solution may be difficult and selection of the wrong solution may lead to unsatisfied consumers.

SUMMARY OF THE INVENTION

It is an object of the present invention to overcome the above-mentioned problems, and to provide a light emitting device capable of providing both a spotty lighting effect and a diffuse lighting effect, and with which straight forward selection between the spotty and a diffuse lighting effect and thus easy selection of the right lighting solution, as well as to change it if required, is enabled, which even allows end-users to select the lighting solution as they like, with which a minimal number of components and material is used, which is flexible and cheap, and which has a good optical efficiency even when the diffuse lighting solution is chosen.

According to a first aspect of the invention, this and other objects are achieved by means of a light emitting device comprising a longitudinal direction, a longitudinal axis, L, extending in the longitudinal direction, a transversal direction, a transversal axis, T, extending in the transversal direction, a height direction being perpendicular to both the longitudinal direction and the transversal direction and a height axis, H, extending in the height direction, a reflector comprising a cavity extending in parallel with the longitudinal axis, a substrate, and a plurality of LEDs adapted for, in operation, emitting light, and being arranged on the substrate in such a way as to extend in a direction parallel with the longitudinal axis of the light emitting device, a sleeve extending in parallel with the longitudinal axis, the sleeve comprising a first part made of a transparent or translucent material, a second part made of a diffuse material, and a channel extending in parallel with the longitudinal axis and being provided in the first part of the sleeve, the substrate with the plurality of LEDs mounted thereon being arranged in the channel of the sleeve, the cavity being adapted for receiving any one of the first part and the second part of the sleeve, and the sleeve being adapted for being mounted in the reflector by inserting any one of the first part and the second part into the cavity, such that when the first part of the sleeve is received in the cavity of the reflector, light emitted by the plurality of LEDs is travelling first through the first part of the sleeve, then being reflected by the reflector and last travelling through and being emitted from the second part of the sleeve, and such that when the second part of the sleeve is received in the cavity of the reflector, light emitted by the plurality of LEDs is travelling through and being emitted from the first part of the sleeve.

By providing a channel in the sleeve and mounting the substrate with the plurality of LEDs mounted thereon in the channel of the sleeve, a light emitting device is provided with which a stable positioning and mounting of the substrate along the whole length thereof is obtained. Furthermore, the substrate with the plurality of LEDs mounted thereon is effectively shielded from the surroundings when mounted in the channel of the sleeve, thus providing a light emitting device suitable for outdoor and indoor use alike.

Preferably but not necessary, the substrate is a flexible substrate.

By providing a reflector with a cavity being adapted for receiving any one of the first part and the second part of the sleeve, and by providing a sleeve with a first part and a second part and being adapted for being mounted in the reflector by inserting any one of the first part and the second part into the cavity, a light emitting device is provided with which a minimal number of components and material is used, and which is flexible and cheap.

By providing the sleeve with a first part made of a transparent or translucent material and a second part made of a diffuse material, a light emitting device adapted for providing both a spotty and a diffuse lighting solution is provided for.

By furthermore providing the sleeve as being adapted for being mounted in the reflector by inserting any one of the first part and the second part into the cavity, such that when the first part of the sleeve is received in the cavity of the reflector, light emitted by the plurality of LEDs is travelling first through the first part of the sleeve, then being reflected by the reflector and last travelling through and being emitted from the second part of the sleeve, and such that when the second part of the sleeve is received in the cavity of the reflector, light emitted by the plurality of LEDs is travelling through and being emitted from the first part of the sleeve, a light emitting device is provided with which straight forward selection between a spotty and a diffuse lighting effect is enabled and thus easy selection of the right lighting solution, as well as to change it if required, is enabled, which even allows end-users to select the lighting solution as they like. Also, this solution has, when choosing the spotty lighting effect, the substrate and LEDs positioned in such way that the cove is integrated and the light directed sideways.

Furthermore, such a light emitting device has a good optical efficiency even when the diffuse lighting solution is chosen.

In an embodiment the plurality of LEDs is mounted asymmetrically on the substrate with respect to the longitudinal axis of the light emitting device in a direction away from the second part of the sleeve.

Thereby a light emitting device is provided in which a large distance from the LEDs to the light exit window is allowed for, which in turn optimizes the mixing of the light.

In an embodiment where each LED of the plurality of LEDs comprises a respective light output surface arranged facing in a main direction, M, and where the substrate with the plurality of LEDs mounted thereon is arranged in the channel in such a way that the substrate is arranged in an angle, $\theta$, different from zero degrees with respect to the longitudinal axis of the light emitting device and the said main direction, M, is arranged in an angle, $\beta$, different from or equal to zero degrees with respect to the height axis of the light emitting device.

Thereby a light emitting device is provided with which the intensity of the light at the light exit surface is increased as losses in the light path between the LEDs and the light exit surface is lowered.

In a particular embodiment, the angle $\beta$ is smaller than 20 degrees such as to allow flexibility.

In an embodiment the channel provided in the first part of the sleeve seen in cross-section encloses the substrate with the plurality of LEDs mounted thereon.

Thereby, a light emitting device is provided with which the substrate with the plurality of LEDs mounted thereon is arranged completely shielded from the surroundings such as to increase the robustness and durability of the light emitting device.

In an embodiment the second part of the sleeve comprises at least two diffusing layers.

Thereby an improved degree of diffusion and thus uniformity of the light emitted by the light emitting device is obtained. Also, the direct light from the LEDs is thereby shielded.

In an embodiment the at least two diffusing layers are spaced apart by a spacing layer.

Thereby a light emitting device is provided in which a large distance from the LEDs to the light exit window is allowed for, which in turn optimizes the mixing of the light.

In an embodiment the reflector further comprises a channel arranged adjacent to a bottom of the cavity, the channel being adapted for receiving a mounting element.

Thereby a light emitting device is provided which is simple and straight forward to mount on a structure, e.g. a building structure such as a wall of a ceiling, by means of a fastening element inserted into the channel in the reflector.

Furthermore, it is a well-known problem that the flexible behaviour of a LED strip makes it quite difficult to be mounted in a straight configuration or nicely curved in well-defined curves. Mounting the LED strip with small brackets spaced along the length has been suggested, but this will cause the LED strip to sag between two brackets, unless a lot of brackets are used.

With the above solution, however, the provision of a reflector with an integrated channel or mounting profile along the full length of the LED strip allows for the use of an unlimited amount of mounting elements to mount the profile to a surface in any desired shape. Such mounting elements may for instance be screws, nails, tape, glue, etc.

Hence, the above-mentioned solution provides a light emitting device which can be mounted by consumers in ways they prefer, e.g. with screws or nails through the profile, tape or glue. Thereby, a robust sealing of the light emitting device towards the surroundings is obtained, thus providing a light emitting device suitable for outdoor and indoor use alike.

In an embodiment the sleeve comprises at least one male or female first engagement element and the reflector comprises at least one female or male second engagement element adapted for engagement with said first engagement element.

In an embodiment the at least one first engagement element and the at least one second engagement element are adapted for forming a snap locking engagement or a frictionally locking engagement.

Thereby a simple and straight forward releasable engagement between the sleeve and the reflector is provided for. As such engagement elements may easily be made as elements integral with the sleeve or reflector, as the case may be, a minimum of components is used.

In an embodiment the cavity of the reflector comprises a shape complementary to that of the first part of the sleeve.

Thereby a particularly simple mounting of the first part of the sleeve is obtained while ensuring correct mounting at all times, as only one mounting position of the first part of the sleeve is possible.

In an embodiment the first part and the second part of the sleeve comprises identical but mirror inverted shapes.

Thereby a light emitting device is provided with which the mounting of the sleeve by insertion of the first or the second part of the sleeve into the cavity in the reflector is made particularly simple and straight-forward, while ensuring correct mounting at all times, as only one mounting position of each of the first part and the second part of the sleeve is possible. Furthermore, a light emitting device is provided with which an identical look as perceived by a user is obtained regardless of whether the first or the second part of the sleeve is inserted into the cavity in the reflector.

In an embodiment the first part and the second part of the sleeve are made in one piece.

Thereby a light emitting device is provided which is particularly simple and thus cost effective to produce. Such a sleeve may be manufactured by e.g. co-extrusion.

In an embodiment the second part of the sleeve is detachable from the first part of the sleeve.

Thereby a light emitting device is provided with which change between a spotty and a diffuse lighting effect is enabled is a particularly simple manner, namely by simply removing or attaching the second, diffusing, part of the sleeve from or to the first part of the sleeve.

In an embodiment the sleeve and the first part of the sleeve comprise complementary connection elements.

Thereby a particularly simple removal and attachment of the second part of the sleeve is obtained while ensuring correct mounting at all times, as only one mounting position of the second part of the sleeve on the first part of the sleeve is possible.

The invention furthermore, in a second aspect, concerns a lamp, a luminaire or a lighting fixture comprising a light emitting device according to the invention.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
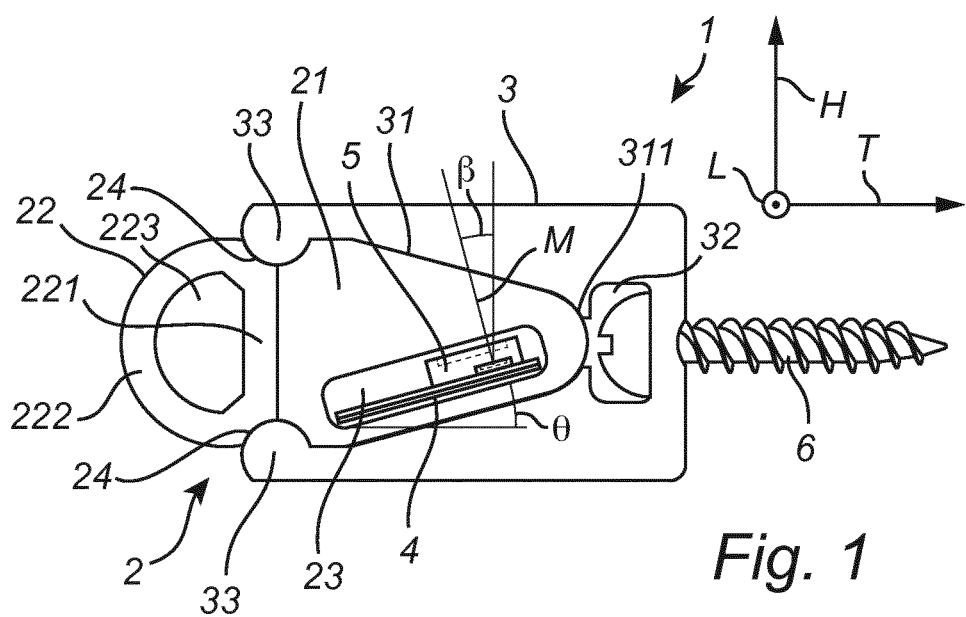
FIG. 1 shows a cross sectional view of a light emitting device according to a first embodiment of the invention with a sleeve mounted in a reflector to obtain a diffuse lighting effect, a mounting element furthermore being visible.
Figure 2:
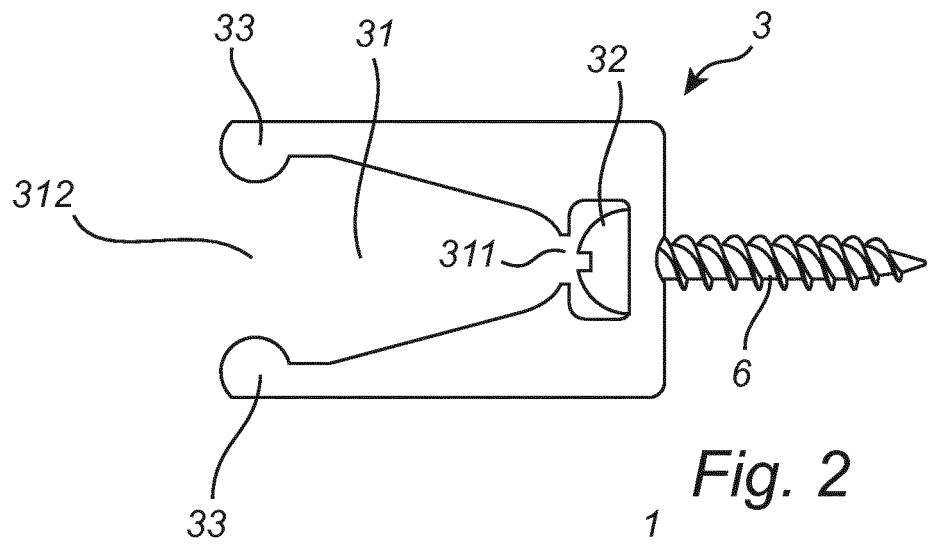
FIG. 2 shows a cross sectional view of the reflector of the light emitting device according to FIG. 1.
Figure 3:
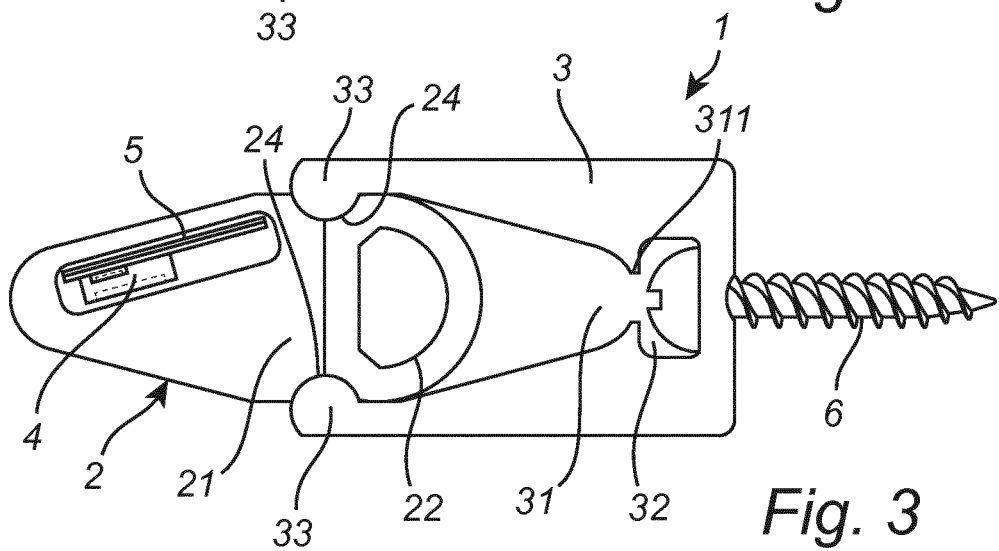
FIG. 3 shows a cross sectional view of the light emitting device according to FIG. 1 with the sleeve mounted in the reflector to obtain a spotty lighting effect.

FIGS. 1 to 3 show cross sectional views of a light emitting device 1 according to a first embodiment of the invention in a configuration enabling a diffuse lighting effect, with the reflector shown on its own and in a configuration enabling a spotty lighting effect, respectively.

Generally, for all embodiments and as illustrated on FIG. 1, the light emitting device 1 comprises a longitudinal direction, a longitudinal axis L extending in the longitudinal direction, a transversal direction, a transversal axis T extending in the transversal direction, a height direction being perpendicular to both the longitudinal direction and the transversal direction and a height axis H extending in the height direction.

Generally, and for all embodiments, the light emitting device 1 further comprises a sleeve 2, a reflector 3, a substrate 4 and a plurality of LEDs 5.

The plurality of LEDs 5 may be any suitable type of LEDs and may emit light of any desired color and/or color temperature. Typically, however, the plurality of LEDs 5 are LEDs emitting white light. Each LED 5 of the plurality of LEDs 5 comprises a respective light output surface arranged facing in a main direction M, cf. FIG. 1.

The plurality of LEDs 5 is mounted on the substrate 4. Hence, the substrate is a substrate suitable for carrying the plurality of LEDs 5 and the wiring necessary to supply electrical power to the LEDs, such as but not limited to a printed circuit board.

More particularly, the plurality of LEDs 5 is arranged on the substrate 4 in such a way as to extend in a direction parallel with the longitudinal axis L of the light emitting device 1 and asymmetrically on the substrate 4 with respect to the longitudinal axis L of the light emitting device 1 in a direction away from a second part 22 of a sleeve 2 to be described in the following. In other embodiments, however, the plurality of LEDs 5 is arranged symmetrically on the substrate 4 with respect to the longitudinal axis L of the light emitting device 1 in a direction away from a second part 22 of the sleeve 2.

The sleeve 2 extends in parallel with the longitudinal axis L. The sleeve 2 comprises a first part 21 made of a transparent or translucent material, a second part 22 made of a diffusing material. The first part 21 and the second part 22 of the sleeve 2 are generally and in all embodiments arranged in extension of one another in the transversal direction of the light emitting device 1. In the figures a transition between the first part 21 and the second part 22 of the sleeve 2 is shown as a line extending substantially in parallel with the height axis H of the light emitting device 1. In other embodiments the said transition may, however, extend in a different direction, such as in an acute angle with the height axis H of the light emitting device 1. Also, in the embodiments shown on the figures the first part 21 and the second part 22 each account for about half the sleeve 2 both in terms of volume and surface area, although in other embodiments other distributions in terms of volume and/or surface area between the first part 21 and the second part 22 of the sleeve 2 may be chosen.

A channel 23 extending in parallel with the longitudinal axis L is provided in the first part 21 of the sleeve 2. Generally, the substrate 4 and the plurality of LEDs 5 are arranged in the channel 23. In the embodiment shown in FIGS. 1 and 3, the substrate 4 with the plurality of LEDs 5 mounted thereon is arranged in the channel 23 in such a way that the substrate 4 is arranged in an angle θ different from zero degrees with respect to the transversal axis T of the light emitting device and the said main direction M of each of the LEDs 5 is arranged in an angle β different from zero degrees with respect to the height axis H of the light emitting device 1. When seen in cross-section, the channel 23 furthermore encloses the substrate 4 with the plurality of LEDs 5 mounted thereon on all sides. The channel 23 is enclosed on all sides by the material of the first part 21 of the sleeve 2, thereby ensuring that a part of the optical path extends through the first part 21. However, the channel 23 may also be provided adjacent to the transition between the first part 21 and the second part 22 of the sleeve. Also, the channel 23 may be open at one or both opposite longitudinal ends such as to allow for replacement of the substrate 4 with the plurality of LEDs 5 mounted thereon and/or of an LED 5 of the plurality of LEDs 5, e.g. in case of malfunction.

In the embodiment shown in FIGS. 1 and 3, the second part 22 of the sleeve comprises two diffusing layers 221, 222. The two diffusing layers 221, 222 may have identical or different diffusing properties. In other embodiments, the second part 22 of the sleeve 2 may also comprise one or more than two diffusing layers. In the embodiment shown in FIGS. 1 and 3, the two diffusing layers 221, 222 are furthermore spaced apart by a spacing layer 223. The spacing layer 223 may be an air gap, or it may be a transparent material.

In the embodiment shown in FIGS. 1 and 3 the first part 21 and the second part 22 of the sleeve are made in one piece, for instance by being co-extruded or co-molded. Furthermore, the first part 21 of the sleeve may be provided with a shape complementary to the shape of the cavity 31 of the reflector 3.

With reference also to FIG. 2, the reflector 3 comprises a cavity 31 extending in parallel with the longitudinal axis L of the light emitting device 1. The cavity comprises a bottom 311 and an open end 312 opposite to the bottom 311. In the embodiment shown the cavity comprises a shape tapering from the open end 312 towards the bottom 311. However, the cavity 31 is not limited to having any specific shape.

The cavity 31 is adapted for receiving any one of the first part 21 and the second part 22 of the sleeve. Thus, the sleeve 2 is adapted for being mounted in the reflector 3 by inserting any one of the first part 21 and the second part 22 into the cavity 31. When the first part 21 of the sleeve 2 is inserted in the cavity 31 of the reflector 3, light emitted by the plurality of LEDs 5 is travelling first through the first part 21 of the sleeve 2, then being reflected by the reflector 3 and last travelling through and being emitted from the second part 22 of the sleeve. Thereby a diffuse lighting effect is obtained. When the second part 22 of the sleeve 2 is received in the cavity 31 of the reflector, light emitted by the plurality of LEDs 5 is travelling through the first part 21 of the sleeve 2 and is emitted from the first part 21 of the sleeve 2. Thereby a spotty lighting effect is obtained.

Furthermore, as the sleeve 2 shown in FIGS. 1 and 3 is symmetrical about the transversal axis T of the light emitting device 1, it is in this embodiment furthermore possible in each of the two above-mentioned orientations to mount the sleeve 2 in the cavity 31 in such a way that the light emitted from each of the LEDs 5 of the plurality of LEDs 5 is emitted in either of a downwards or an upwards direction.

The reflector 3 furthermore comprises a channel 32 extending in parallel with the longitudinal axis L of the light emitting device. The channel 32 is arranged adjacent to the bottom 311 of the cavity 31, and may be open towards the cavity 31. The channel 32 is adapted for receiving a mounting element 6, such as a screw, a nail or a bolt. The reflector 3 thus also functions as a mounting profile.

The sleeve 2 comprises a pair of female first engagement elements 24 in the form of recesses. The reflector 3 comprises a pair of male second engagement elements 33 adapted for engagement with the first engagement element 24. In the embodiment shown, the male second engagement elements 33 are provided as protrusions corresponding to the recesses in the sleeve 2. Thereby, the first engagement elements 24 and the second engagement elements 33 are adapted for forming a snap locking engagement between the sleeve 2 and the reflector 3.

The first engagement elements 24 are provided at a transition, which in the figures is shown as a full line, between the first part 21 and the second part 22 of the sleeve. The second engagement elements 33 are provided at the open end 312 of the cavity 31 of the reflector 3. Thereby it is ensured that when mounting the sleeve in the reflector that the one of the first part 21 and the second part 22 being inserted into the cavity 31 in the reflector 3 is arranged extending fully within the cavity 31, while the other one of the first part 21 and the second part 22 extends at least partly, and in the embodiment shown on FIGS. 1 and 3 fully, outside the reflector 3.

It is noted that the stiffness or flexibility as well as the shape of the reflector 3 may be chosen according to application, need and/or desire.

Figure 4:
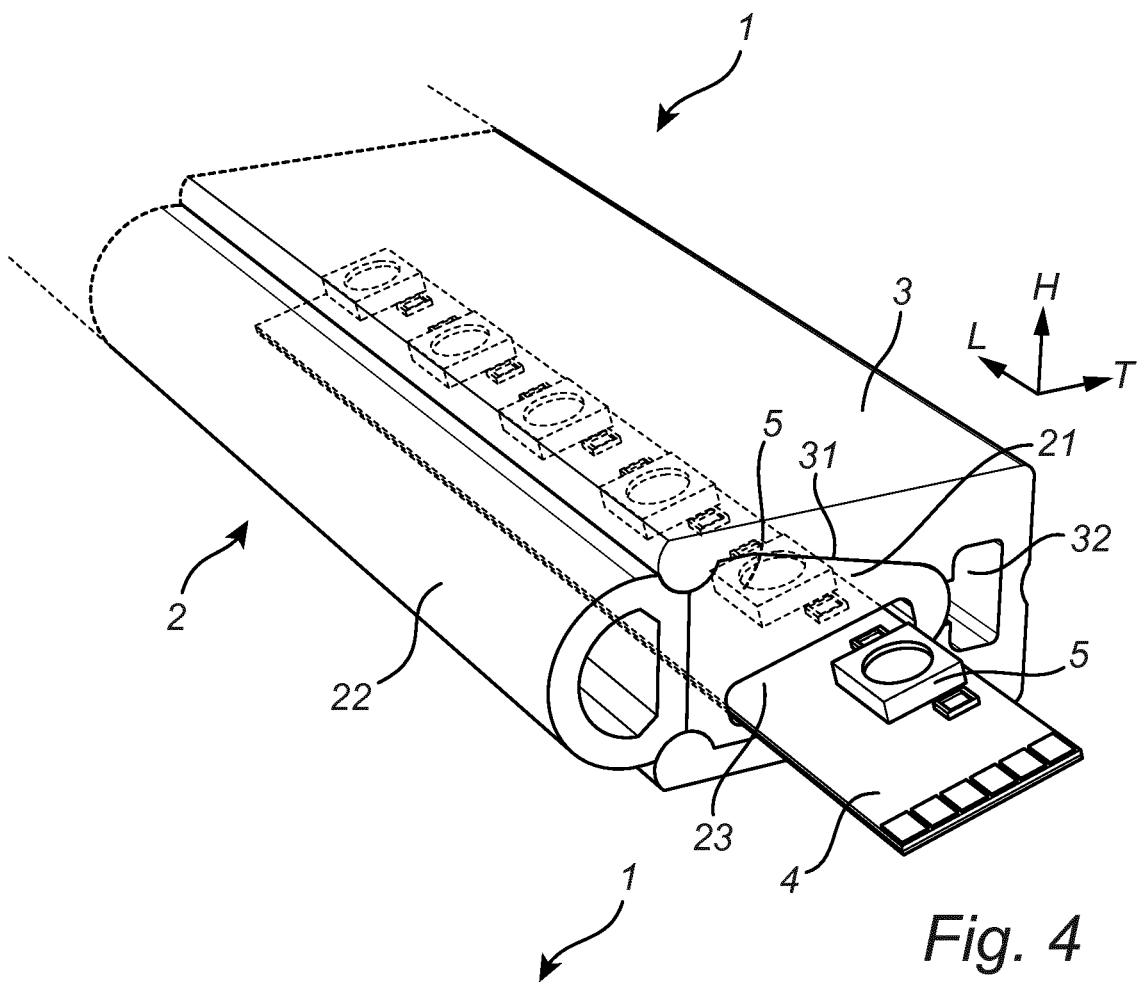
FIG. 4 shows a perspective view of the light emitting device according to FIG. 1 with the sleeve mounted in the reflector to obtain a diffuse lighting effect.
Figure 5:
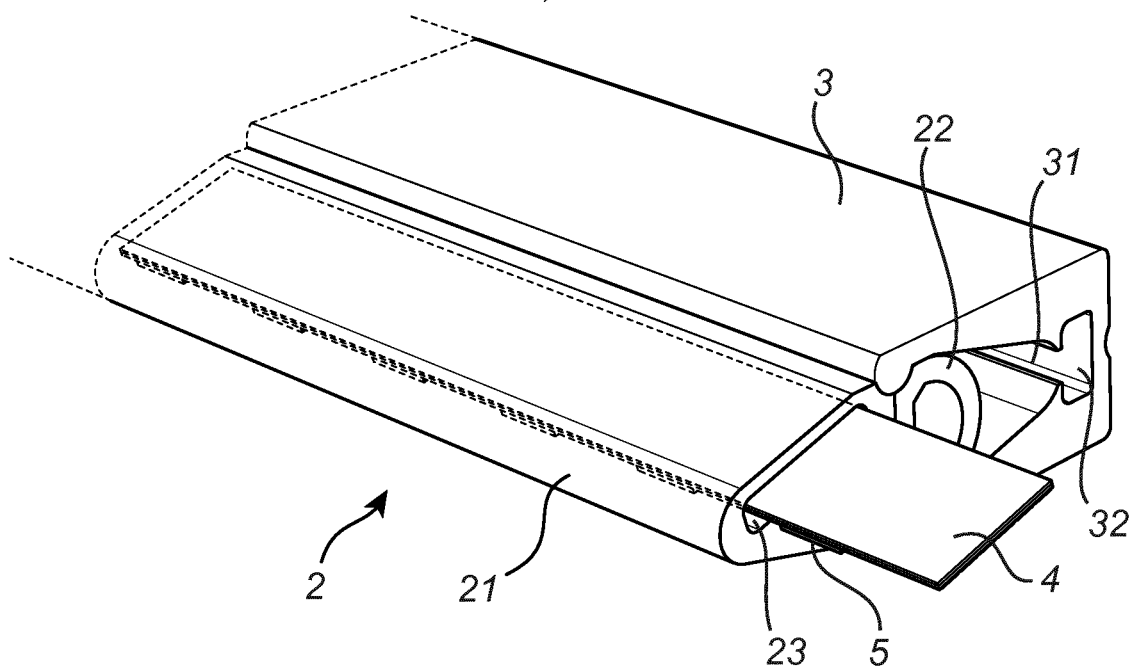
FIG. 5 shows a perspective view of the light emitting device according to FIG. 1 with the sleeve mounted in the reflector to obtain a spotty lighting effect.

FIGS. 4 and 5 show perspective views of the light emitting device 1 in configurations corresponding to those shown in FIGS. 1 and 3, respectively. As may be seen, the substrate 4 with the plurality of LEDs 5 mounted thereon, the sleeve 2 and the reflector 3 are all elongated elements. Also, the substrate 4 with the plurality of LEDs 5 mounted thereon may be provided as a LED strip.

The substrate 4 with the plurality of LEDs 5 mounted thereon may be inserted into the channel 23 from an end of the sleeve 2. Likewise, the sleeve 2 may be slid into the cavity 31 from an end of the reflector 3. Alternatively, the sleeve 2 may be pushed or snapped into the cavity 31 through the open end 312.

Furthermore, the opposite longitudinal ends of the light emitting device 1, and thus of the sleeve 2 and reflector 3 may be closed by means of end caps, which may additionally be sealed by e.g. gluing or welding.

Figure 6:
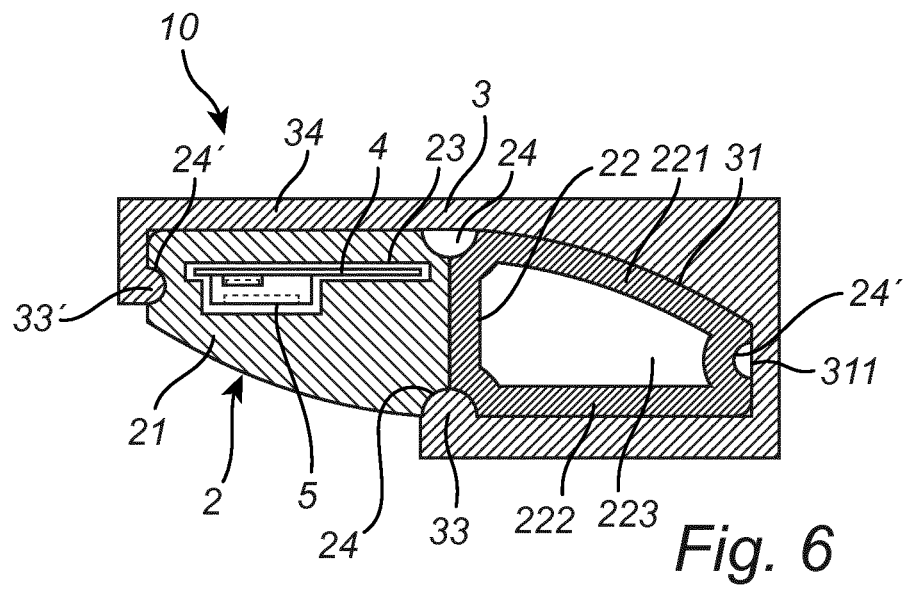
FIG. 6 shows a cross sectional view of a light emitting device according to a second embodiment of the invention with the sleeve mounted in the reflector to obtain a spotty lighting effect.
Figure 7:
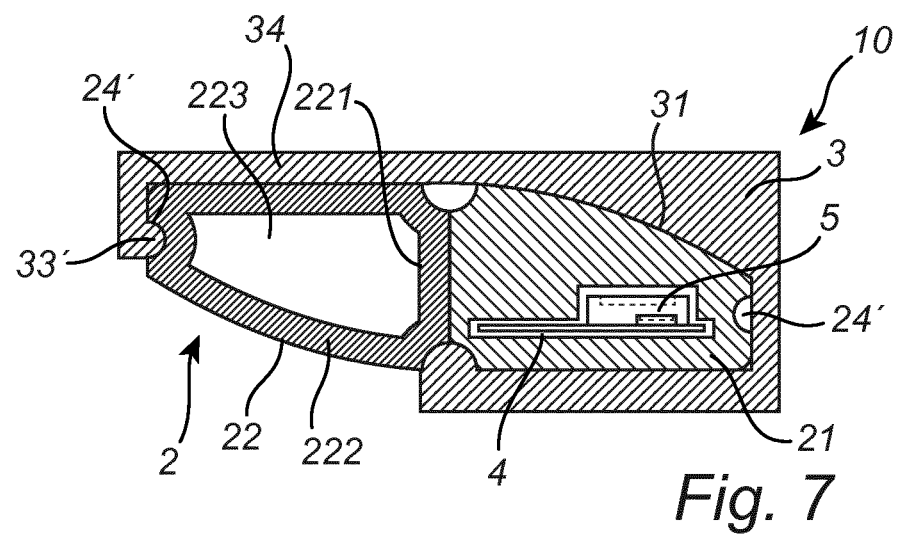
FIG. 7 shows a cross sectional view of the light emitting device according to FIG. 6 with the sleeve mounted in the reflector to obtain a diffuse lighting effect.

Turning now to FIGS. 6 and 7, cross sectional views of a light emitting device 10 according to a second embodiment of the invention in a configuration enabling a diffuse lighting effect and in a configuration enabling a spotty lighting effect, respectively, are shown.

In the following only the features of the light emitting device 10 shown in FIGS. 6 and 7 that differ from those described in relation to FIGS. 1-3 will be described.

The light emitting device 10 comprises a sleeve 2 with a first part 21 and a second part 22. The first part 21 and the second part 22 of the sleeve 2 differ from those described above in that their respective shapes are identical but mirror inverted about the transversal axis T of the light emitting device 10.

Furthermore, the reflector 3 comprises an extension 34 comprising a male third engagement element 33' at the end of the extension 34. The extension 34 is furthermore angled or hook-shaped. Hence, each of the first part 21 and the second part 22 of the sleeve 2 comprises a female fourth engagement element 24' adapted for engagement with the male third engagement element 33'. Of course, a male connection element may alternatively be provided on each the first part 21 and the second part 22 of the sleeve 2 and a female connection element on the extension 34.

Due to the extension 34 of the reflector 3, the one of the first part 21 and the second part 22 being inserted into the cavity 31 in the reflector 3 is arranged extending fully within the cavity 31, while the other one of the first part 21 and the second part 22 extends partly outside the reflector.

Also, the substrate 4 with the plurality of LEDs 5 mounted thereon is arranged in the channel 23 in such a way that the substrate 4 is arranged in an angle of zero degrees with respect to the transversal axis T of the light emitting device 10 and the main direction M of each of the LEDs 5 of the plurality of LEDs 5 is arranged in an angle of zero degrees with respect to the height axis H of the light emitting device 10.

Figure 8:
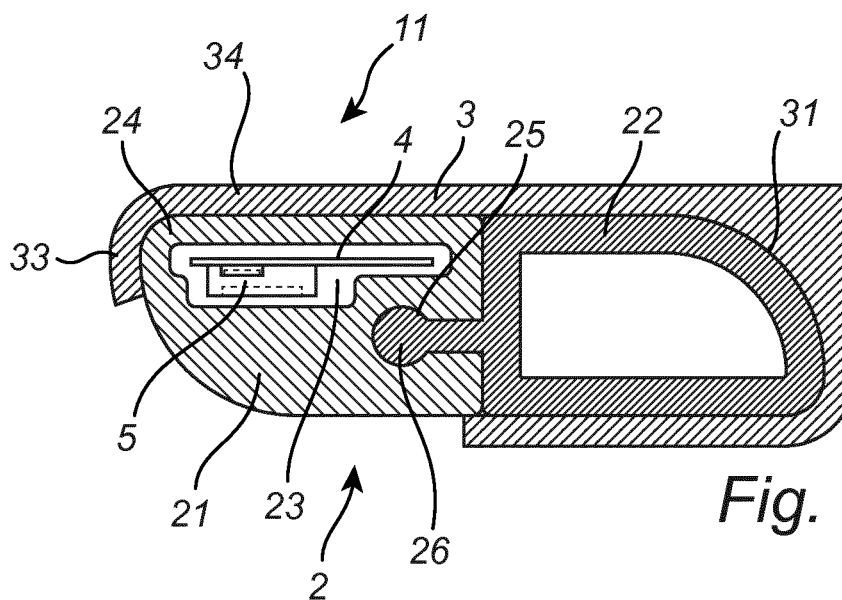
FIG. 8 shows a cross sectional view of a light emitting device according to a third embodiment of the invention with the sleeve mounted in the reflector to obtain a spotty lighting effect, the sleeve comprising a first part and a second part being detachable from one another.
Figure 9:
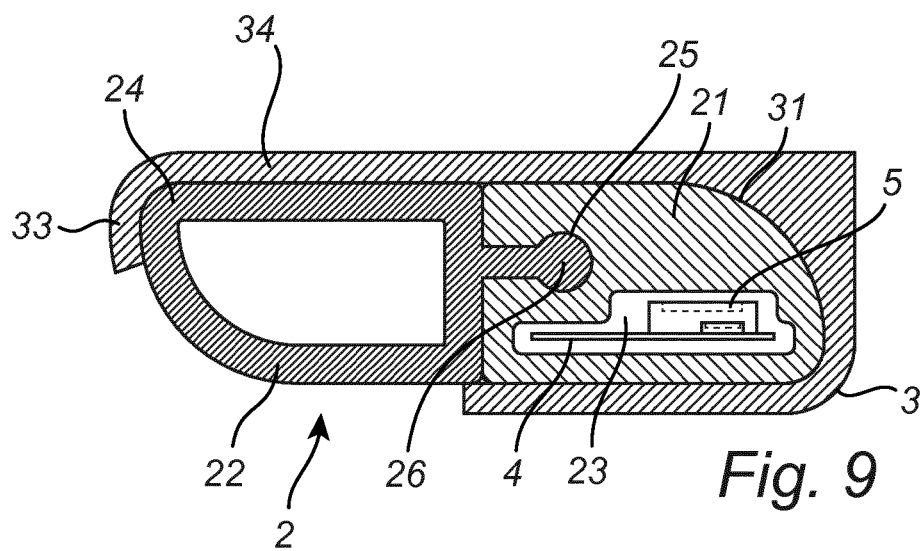
FIG. 9 shows a cross sectional view of the light emitting device according to FIG. 8 with the sleeve mounted in the reflector to obtain a diffuse lighting effect.
Figure 10:
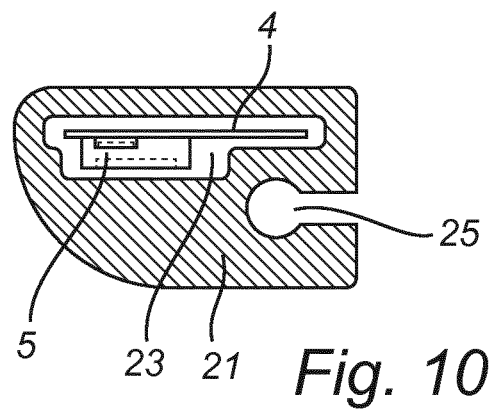
FIG. 10 shows a cross sectional view of the first part of the sleeve of the light emitting device according to FIG. 8, the second part of the sleeve being detached.

Turning now to FIGS. 8 and 9, cross sectional views of a light emitting device 11 according to a third embodiment of the invention in a configuration enabling a diffuse lighting effect and in a configuration enabling a spotty lighting effect, respectively, are shown. FIG. 10 shows the first part 21 of the sleeve 2 of such a light emitting device 11.

The light emitting device 11 shown in FIGS. 8 to 10 differs from that shown in FIGS. 6 and 7 only in virtue of the following features.

The first part 21 and the second part 22 of the sleeve 2 are constructed to be detachable from one another. Therefore, the first part 21 of the sleeve 2 comprises a female connection element 25 and the second part 22 of the sleeve 2 comprises a complementary male connection element 26. Of course, the male connection element may alternatively be provided on the first part 21 of the sleeve 2 and the female connection element on the second part 22 of the sleeve 2. The first part 21 and the second part 22 of the sleeve 2 furthermore have a shape differing from that shown in FIGS. 6 and 7.

Furthermore, the second engagement element 33 is provided at the end of the extension 34 and the complementary first engagement element 24 is provided on each of the first part 21 and the second part 22 of the sleeve 2 on mutually opposite ends of the first part 21 and the second part 22, respectively. The second engagement element 33 is in this embodiment provided as a bent end of the extension 34, and the first engagement element 24 is provided as a nose on each of the first part 21 and the second part 22 of the sleeve 2, respectively. Also, the engagement elements provided at the transition between the first part 21 and the second part 22 of the sleeve 2 are in this embodiment omitted.

This configuration is simpler and cheaper to produce, since the extrusion device or mold needed for the manufacture of the sleeve 2 and reflector 3, respectively, has a simpler structure as compared to the device or mold needed for manufacturing the sleeve 2 and reflector 3 of the light emitting devices 1 and 10 according to the first and second embodiment, respectively.

In a further embodiment, a light emitting device 1, 10 or 11 according to the invention may also be used without using a reflector 3. In such an embodiment most of the light is emitted from the first part 21 and a small part is emitted from the second part 22. Also, in such an embodiment, the light emitting device may optionally comprise another type of cover or covering element in which the sleeve 2 is arranged.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting device comprising a longitudinal direction, a longitudinal axis (L) extending in the longitudinal direction, a transversal direction, a transversal axis (T) extending in the transversal direction, a height direction being perpendicular to both the longitudinal direction and the transversal direction and a height axis (H) extending in the height direction,
a reflector comprising a cavity extending in parallel with the longitudinal axis,
a substrate,
a plurality of LEDs adapted for, in operation, emitting light, and being arranged on the substrate in such a way as to extend in a direction parallel with the longitudinal axis of the light emitting device, and
a sleeve extending in parallel with the longitudinal axis, the sleeve comprising a first part made of a transparent or translucent material, a second part made of a diffuse material, and a channel extending in parallel with the longitudinal axis and being provided in the first part of the sleeve,
the substrate with the plurality of LEDs mounted thereon being arranged in the channel of the sleeve, wherein
the cavity is adapted for receiving any one of the first part and the second part of the sleeve, and the sleeve being adapted for being mounted in the reflector by inserting any one of the first part and the second part into the cavity, wherein,
when the first part of the sleeve is received in the cavity of the reflector, light emitted by the plurality of LEDs is travelling first through the first part of the sleeve, then being reflected by the reflector and last travelling through and being emitted from the second part of the sleeve, and wherein
when the second part of the sleeve is received in the cavity of the reflector, light emitted by the plurality of LEDs is travelling through and being emitted from the first part of the sleeve.

2. A light emitting device according to claim 1, wherein each LED of the plurality of LEDs is mounted asymmetrically on the substrate with respect to the longitudinal axis of the light emitting device in a direction away from the second part of the sleeve.

3. A light emitting device according to claim 1, wherein each LED of the plurality of LEDs comprises a respective light output surface arranged facing in a main direction (M), and wherein the substrate with the plurality of LEDs mounted thereon is arranged in the channel in such a way that the substrate is arranged in an angle θ different from or equal to zero degrees with respect to the longitudinal axis of the light emitting device and the said main direction is arranged in an angle β different from or equal to zero degrees with respect to the height axis of the light emitting device.

4. A light emitting device according to claim 1, wherein the channel provided in the first part of the sleeve seen in cross-section encloses the substrate with the plurality of LEDs mounted thereon.

5. A light emitting device according to claim 1, wherein the substrate is a flexible substrate.

6. A light emitting device according to claim 1, wherein the second part of the sleeve comprises at least two diffusing layers.

7. A light emitting device according to claim 6, wherein the at least two diffusing layers are spaced apart by a spacing layer.

8. A light emitting device according to claim 1, wherein the reflector further comprises a channel arranged adjacent to a bottom of the cavity, the channel being adapted for receiving a mounting element.

9. A light emitting device according to claim 1, wherein the sleeve comprises at least one male or female first engagement element and the reflector comprises at least one female or male second engagement element adapted for engagement with said first engagement element.

10. A light emitting device according to claim 9, wherein the at least one first engagement element and the at least one second engagement element are adapted for forming a snap locking engagement or a frictionally locking engagement.

11. A light emitting device according to claim 1, wherein the cavity of the reflector comprises a shape complementary to that of the first part of the sleeve.

12. A light emitting device according to claim 1, wherein the first part and the second part of the sleeve comprise identical but mirror inverted shapes, or are made in one piece.

13. A light emitting device according to claim 1, wherein the second part of the sleeve is detachable from the first part of the sleeve.

14. A light emitting device according to claim 13, wherein the second part of the sleeve and the first part of the sleeve comprise complementary connection elements.

15. A lamp, a luminaire or a lighting fixture comprising a light emitting device according to claim 1.

* * * * *